United States Patent [19]

Baudoux

[11] 4,309,662
[45] Jan. 5, 1982

[54] CIRCUIT FOR RAPIDLY RESYNCHRONIZING A CLOCK

[75] Inventor: Jean-Pierre Baudoux, Paris, France

[73] Assignee: Telecommunications Radioelectriques et Telephoniques T.R.T., New York, N.Y.

[21] Appl. No.: 117,719

[22] Filed: Feb. 1, 1980

[30] Foreign Application Priority Data

Feb. 5, 1979 [FR] France ................... 79 02902

[51] Int. Cl.³ .................. H03K 5/26; H03L 7/06
[52] U.S. Cl. ...................... 328/73; 331/1 A; 328/134; 328/155; 307/269; 307/528
[58] Field of Search ............ 328/72, 73, 74, 134, 328/155; 307/269, 527, 528; 331/1 A

[56] References Cited

U.S. PATENT DOCUMENTS

| | | | |
|---|---|---|---|
| 2,980,858 | 4/1961 | Grondin et al. | 328/73 |
| 3,781,696 | 12/1973 | Van Loon et al. | 331/1 A |
| 3,931,585 | 1/1976 | Barker et al. | 328/134 |
| 3,956,710 | 5/1976 | Seitz et al. | 307/528 |
| 4,131,856 | 12/1978 | Chapman | 328/155 |

*Primary Examiner*—John S. Heyman
*Attorney, Agent, or Firm*—Thomas A. Briody; Robert T. Mayer; Steven R. Biren

[57] ABSTRACT

A circuit for rapidly resynchronizing a clock with an external clock is disclosed. The clock to be synchronized is obtained at the output of a phase-locked loop by dividing the frequency of a reference clock in a frequency divider whose division factor is controlled by a phase controller which detects the deviation between the transitions of the two clocks to be synchronized. According to the invention, the pulses of the reference clock are applied to the phase-locked loop by means of a gate, with this gate being rendered nonconductive by means of the characteristic transition of the clock to be synchronized which follows the appearance of a resynchronizing control signal, and thereafter this gate is rendered conductive by means of a characteristic transition of the external clock.

2 Claims, 2 Drawing Figures

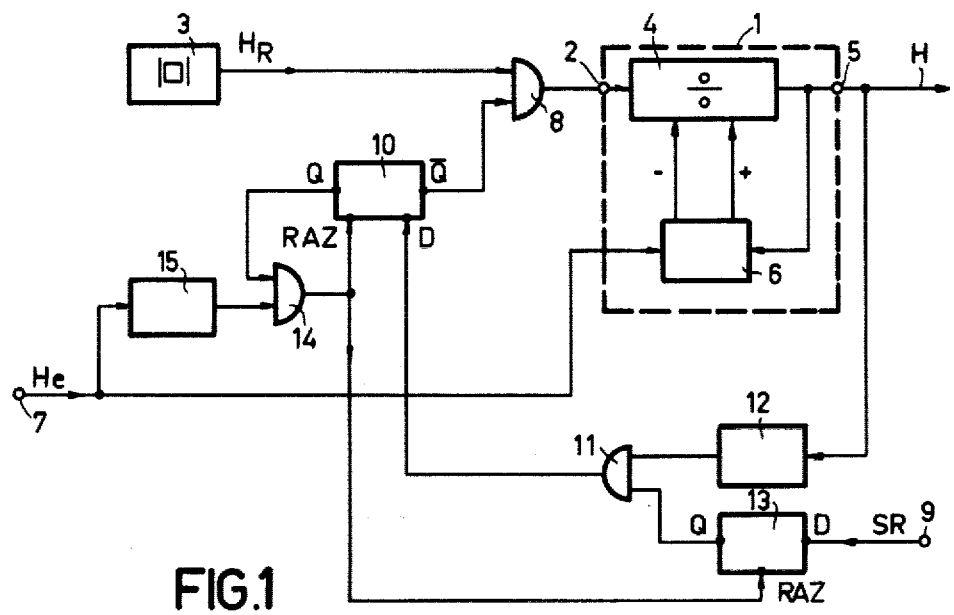
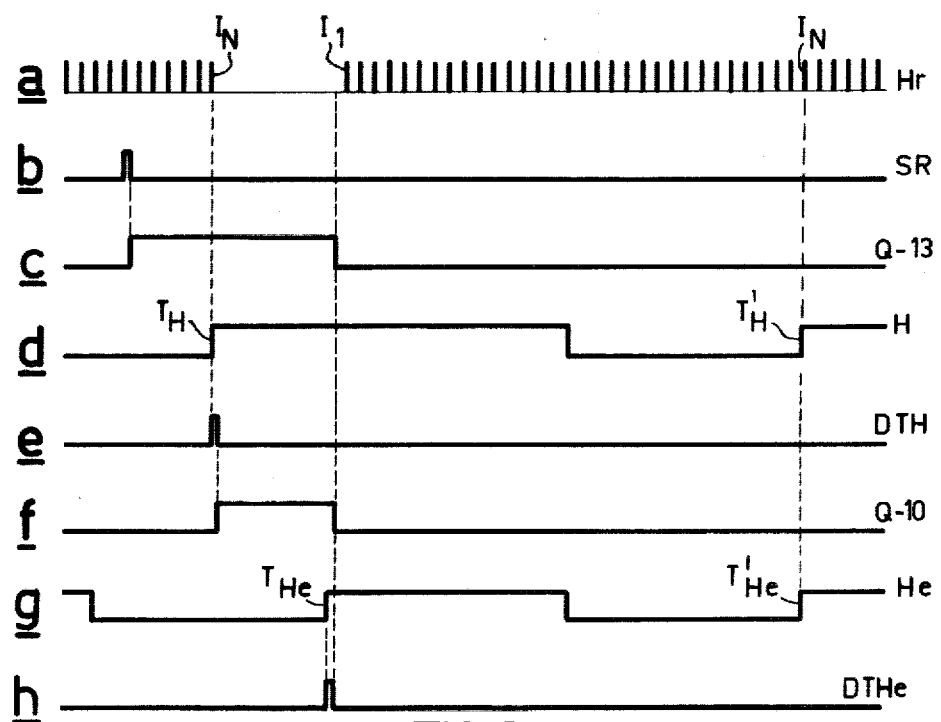

CIRCUIT FOR RAPIDLY RESYNCHRONIZING A CLOCK

BACKGROUND OF THE INVENTION

The invention relates to a circuit for rapidly resynchronizing a clock with an external clock, the generator of the clock to be synchronized comprising a phase-locked loop supplying the desired clock signal by dividing the frequency of a reference clock signal in a frequency divider the division factor of which is controlled by a phase comparator which detects the deviation between characteristic transitions of the two clock signals to be synchronized.

Such a circuit is, for example, used in the receiver of a data transmission system to obtain a local clock which is in synchronism with the external data clock formed from the received data signal. It is important that, at the beginning of each transmission of the data, the synchronization of the local clock with the external clock is effected as rapidly as possible from the instant at which a signal detection circuit has detected the appearance of a data signal at the input of the receiver. When, on the contrary, no measures are taken, this resynchronization may be slow when the above-mentioned phase-locked loop is used.

The clock frequency to be synchronized for a receiver of a data transmission system is low, for example 2400 Hz. The local clock of this frequency is obtained by dividing a high reference frequency which is generally produced by a quartz oscillator. The phase deviation detected by the phase comparator is corrected at the phase-locked loop in the slow rate of the clocks to be synchronized. The value of each correction (positive or negative) is low and corresponds to one or several periods of the high-frequency reference signal in order to maintain an accurate synchronization between the two clocks. On the other hand, however, the time before synchronization is obtained may be very long as, at the start of each transmission, there is an arbitrary phase relation between the two clocks to be synchronized.

A known means to obtain synchronization rapidly is to reset the counter which constitutes the frequency divider applying the local clock to zero at the instant the first characteristic transition of the external clock signal occurs. This resetting operation produces a characteristic transition of the local clock and the two clocks are therefore in synchronism at that instant; thereafter the phase-locked loop operates in the normal manner to keep thereafter the two clocks synchronized.

However, the rapid resynchronizing process cannot be used in all circumstances. In the commercially available integrated circuits which function as the phase-locked loop and which particularly comprise the counter functioning as the frequency divider, there is, for example no input for resetting this counter to zero.

SUMMARY OF THE INVENTION

The present invention has for its object to provide another means for rapidly resynchronizing an external clock, which does not require a particular input to the frequency divider counter and which can be used in particular with phase-locked loops implemented by means of integrated circuits. According to the invention, the reference clock pulses are applied to the phase-locked loop by means of a gate, and means are provided to block this gate by the characteristic transition of the clock to be synchronized which follows the appearance of a resynchronizing control signal, and to render this gate conductive thereafter by a characteristic transition of the external clock.

The following description, given by way of nonlimitative example with reference to the accompanying drawings will show how the invention may be carried into effect.

BRIEF DESCRIPTION OF THE DRAWING

FIG. 1 shows the circuit diagram of the resynchronizing circuit according to the invention.

FIG. 2 shows a timing diagram of signals occurring in the resynchronizing circuit according to FIG. 1.

DETAILED DESCRIPTION

The circuit according to the invention shown in FIG. 1 has for its object to acquire rapid synchronization of a clock H with an external clock He. A well-known arrangement for obtaining a clock H which is synchronous with an external clock He uses a digital phase-locked loop 1 having an input 2 which directly receives a reference clock Hr produced by a quartz oscillator 3 and having a high frequency relative to the frequency of the clocks to be synchronized. In the phase-locked loop the frequency of the reference clock Hr is applied to a variable frequency divider 4, which supplies the clock H at the output 5 of the loop 1. The phase-locked loop comprises a phase comparator 6 which detects, at the rate of the clock H, the phase deviation between the characteristic transitions of the clock signal H and the external clock signal He available at terminal 7. The phase comparator 6 indicates, for example, only the polarity of this phase deviation.

The division factor of the frequency divider 4 has a nominal value N, which enables a clock frequency H equal to or very near the nominal frequency of the external clock He to be obtained. When the phase comparator 6 detects that the phase of the transitions of the clock signal H leads the transitions of the external clock signal He, it applies to the frequency divider 4, via the wire denoted by +, a control pulse which changes its division factor from N to N+k in such a way that the detected phase lead is reduced. When a phase lag is detected, the phase comparator applies to the frequency divider via the wire denoted by—a control pulse which changes it division factor from N to N−k in such a way that the detected phase lag is reduced. The frequency divider 4 is a binary counter having, for example, a fixed modulo N counter and producing, in the absence of the above-mentioned control pulse, a nominal frequency division factor equal to N. The division factors N+k and N−k are obtained by means of these control pulses by suppressing or adding k pulses of the frequency of the reference clock Hr at the input of this binary counter. Thus, the transitions of the clock signal H are synchronized with the transitions of the external clock He by correcting the detected phase deviations in steps kT, T being the period of the reference clock Hr. To maintain, during operation, an accurate synchronization between the two clocks H and He the steps kT must have a low value relative to the higher value of the periods of the clocks H and He. However, the time to obtain synchronization acquisition may be very long when the phase deviation between the two clocks to be synchronized is considerable.

A known means to obtain in that case a rapid resynchronization of the clock H with the external clock He consists of resetting the binary counter constituting the frequency divider 4 at exactly the instant of appearance of the first characteristic transition of the external clock, which follows the appearance of a resynchronizing control signal. Resetting the counter to zero produces a characteristic transition of the clock H, which then has the same phase as the external clock He. Thereafter, it is possible to maintain, as explained above, accurate synchronization by means of the phase-locked loop. This procedure is, however, not always applicable. When, for example, commercially available integrated circuits perform the function of the phase-locked loop 1 there is no input through which the variable divider 4 can be reset to zero.

The present invention provides a different means of rapid resynchronization of the two clocks, by means of which this drawback can be obviated.

According to the invention, the frequency of the reference clock Hr is applied to the input 2 of the phase-locked loop 1 by means of a gate circuit 8, means having been provided to render this gate 8 nonconductive by the characteristic transition of the clock H which follows the appearance at terminal 9 of a resynchronization control signal, and for rendering the gate 8 nonconductive thereafter by means of a characteristic transition of the external clock He.

In the example of FIG. 1, a D-type bistable trigger circuit 10, whose output $\overline{Q}$ is connected to an input of the gate 8 is used to render this gate 8 conductive or nonconductive. This bistable trigger circuit 10 is set in the Q=1 state by a pulse which appears at its D-input and which is received from the output of gate 11. The transition detector 12 produces a pulse at each characteristic transition of the clock signal H to be synchronized, but these pulses are not transmitted by gate 11 to the D-input of the bistable trigger circuit 10 until the bistable trigger circuit 13 is in the Q=1 state. This Q=1 state of the bistable trigger circuit 13 is obtained when a pulse of the synchronizing control signal SR is produced at its D-input. When the bistable trigger circuit 10 is in the Q=1 state, it can be reset to zero by a pulse appearing at its input RAZ and received from the output of the gate 14. The transition detector 15 produces a pulse at each characteristic transition of the external clock signal He but these pulses are not transmitted by the gate 14 to reset the bistable trigger circuit 10 to zero until the latter is actually in the Q=1 state. The pulses transmitted by the gate 14 are also applied to the input RAZ of the bistable trigger circuit 13 to reset it to zero.

The mode of operation of the resynchronizing circuit described above is illustrated by the diagrams shown in FIG. 2. The diagram 2a represents the pulses of the reference clock signal Hr which are transmitted by the gate 8 and are counted in the frequency divider 4, the transitions which are suppressed by the gate 8 and which are consequently not counted are not shown in the diagram. For clarity of the diagram, not all pulses Hr are shown, therefore they appear with a relatively low frequency. At the beginning of the diagram the bistable trigger circuits 10 and 13 are in the Q=0 state, as shown by the diagrams 2f and 2c respectively, and the counter 4 counts the pulses of the clock Hr transmitted by the gate 8. The diagram 2b shows a resynchronizing control signal pulse SR which appears at terminal 9. The descending edge of this pulse SR causes the bistable trigger circuit 13 to change to the Q=1 state (see diagram 2c). The pulse $I_N$ of the reference clock Hr is the last pulse of the counting cycle of the frequency divider 4. This pulse $I_N$ resets this frequency divider automatically to zero, which produces the characteristic transition $T_H$ of the clock signal H to be synchronized, as shown in diagram 2d. In the output signal DTH of the transition detector 12, transition $T_H$ produces a short pulse (shown in diagram 2e) which is transmitted through the then conducting gate 11 to the input D of the bistable trigger circuit 10. The descending edge of pulse DTH causes the bistable trigger circuit 10 to change to the Q=1 state (see diagram 2f). In response thereto the gate 8 no longer transmits the pulses of the reference clock Hr and the frequency divider 4 remains in the zero state. When a characteristic transition $T_{HE}$ of the external clock signal He (shown in diagram 2g) appears, there is produced in the output signal DTHe of the transition detector 15 a short pulse (shown in diagram 2h) which is transmitted through the then conductive gate 14 to the input RAZ of the bistable trigger circuits 10 and 13. The descending edge of this pulse DTHe resets these bistable trigger circuits to zero. Then gate 8 transmits pulses of the reference clock Hr again to the frequency divider 4. Then, frequency divider 4 counts, as a rule, N pulses from $I_1$ to $I_N$, pulse $I_N$ producing a new characteristic transition $T'_H$ of the clock signal H, which is produced substantially at the same instant as the characteristic transition $T'_{He}$ of the external clock signal He, as these two clocks H and He have substantially the same frequency. As the bistable trigger circuit 13 has been reset to zero, the transition $T'_H$ and the characteristic transitions which follow the clock signal H are not detected by the detector 12, the gate 8 remains conductive and the phase-locked loop 1 corrects, as is its function, the slight phase deviations between the characteristic transitions of the two clock signals H and He. If for some reason or other the synchronization between the two clocks is lost, rapid resynchronization can be effected by applying a resynchronizing control pulse to terminal 9.

What is claimed is:

1. A circuit for rapidly resynchronizing a clock with an external clock, the generator of the clock to be synchronized comprising a phase-locked loop supplying the desired clock signal by dividing the frequency of a reference clock signal in a frequency divider, the division factor of which is controlled by a phase comparator which detects the deviation between the characteristic transitions of the two clock signals to be synchronized, characterized in that the reference clock pulses are applied to the phase-locked loop by a gate, and that means are provided for rendering this gate nonconductive by the characteristic transition of the clock to be synchronized which follows the appearance of a resynchronizing control signal, and for thereafter rendering this gate conductive by a characteristic transition of the external clock.

2. A circuit as claimed in claim 1, characterized in that it further comprises a first bistable trigger circuit for controlling said gate, a second bistable trigger circuit for storing the resynchronizing control signal, a first transition detector for forming the pulses which correspond to the characteristic transitions of the clock to be synchronized, said last-mentioned pulses not being transmitted to the first bistable trigger circuit to control cut-off of said gate until the second bistable trigger circuit has received a resynchronizing control signal, and a second transition detector for forming the pulses corresponding to the characteristic transitions of the external clock, said last-mentioned pulses being transmitted to the first and the second bistable trigger circuits to reset them to zero.

* * * * *